(12) United States Patent
Imai et al.

(10) Patent No.: US 9,482,701 B2
(45) Date of Patent: Nov. 1, 2016

(54) DETECTION DEVICE AND METHOD, AND PROGRAM

(75) Inventors: Hiroshi Imai, Nara (JP); Yasuhiro Kawabata, Kyoto (JP); Hiroshi Sameshima, Nara (JP); Shuichi Misumi, Kyoto (JP)

(73) Assignee: OMRON Corporation, Kyoto (JP)

( * ) Notice: Subject to any disclaimer, the term of this patent is extended or adjusted under 35 U.S.C. 154(b) by 826 days.

(21) Appl. No.: 13/989,561

(22) PCT Filed: Mar. 16, 2011

(86) PCT No.: PCT/JP2011/056289
§ 371 (c)(1),
(2), (4) Date: May 24, 2013

(87) PCT Pub. No.: WO2012/073533
PCT Pub. Date: Jun. 7, 2012

(65) Prior Publication Data
US 2013/0245972 A1    Sep. 19, 2013

(30) Foreign Application Priority Data
Nov. 30, 2010  (JP) .................................. 2010-267010

(51) Int. Cl.
*G01R 21/00* (2006.01)
*G01R 19/25* (2006.01)
(Continued)

(52) U.S. Cl.
CPC ............ *G01R 21/00* (2013.01); *G01R 19/2513* (2013.01); *G01R 21/06* (2013.01); *G01R 21/133* (2013.01); *Y02B 10/14* (2013.01)

(58) Field of Classification Search
CPC .. G01R 19/2513; G01R 21/06; G01R 21/00; G01R 21/133; Y02B 10/14
See application file for complete search history.

(56) References Cited

U.S. PATENT DOCUMENTS

| 2002/0013689 A1 | 1/2002 | Hunton |
| 2004/0027112 A1 | 2/2004 | Kondo et al. |

(Continued)

FOREIGN PATENT DOCUMENTS

| CN | 1474492 A | 2/2004 |
| JP | 11-225440 A | 8/1999 |
| JP | 2001268801 A | 9/2001 |

(Continued)

OTHER PUBLICATIONS

International Search Report issued in PCT/JP2011/056289 mailed on Jun. 21, 2011 (2 pages).

(Continued)

*Primary Examiner* — Mischita Henson
(74) *Attorney, Agent, or Firm* — Osha Liang LLP

(57) ABSTRACT

A detection device for detecting a state of electric power has a first current transformer that measures a first current on a first power line side of a connecting point between a first power line derived from a commercial power supply and a second power line derived from a power generation device which supplies electric power equal in frequency to the commercial power supply, a second current transformer that measures a second current on a second power line side of the connecting point, a first calculation unit that calculates a decision value based on a product of a measured value of the first current and a measured value of the second current, and a detection unit that detects a power flow direction of electric power of the first power line based on the decision value.

11 Claims, 11 Drawing Sheets

(51) Int. Cl.
*G01R 21/06* (2006.01)
*G01R 21/133* (2006.01)

(56) References Cited

U.S. PATENT DOCUMENTS

2005/0040809 A1* 2/2005 Uber, III .............. G01R 15/142
324/117 R
2009/0315566 A1* 12/2009 Thiim .................. G01R 31/025
324/551

FOREIGN PATENT DOCUMENTS

| JP | 2004-012376 A | 1/2004 |
|---|---|---|
| JP | 2004-279321 A | 10/2004 |
| JP | 2004-297959 A | 10/2004 |
| JP | 2005229710 A | 8/2005 |
| JP | 2010-107273 A | 5/2010 |
| JP | 2010-141959 A | 6/2010 |

OTHER PUBLICATIONS

Patent Abstracts of Japan for Publication No. 2010-141959, Publication Date: Jun. 24, 2010 (1 Page).
Patent Abstracts of Japan for Publication No. 2010-107273, Publication Date: May 13, 2010 (1 Page).
Patent Abstracts of Japan for Publication No. 2004-012376, Publication Date: Jan. 15, 2004 (1 Page).
Patent Abstracts of Japan for Publication No. 2004-279321, Publication Date: Oct. 7, 2004 (1 Page).
Patent Abstracts of Japan for Publication No. 2004-297959, Publication Date: Oct. 21, 2004 (1 Page).
Patent Abstracts of Japan for Publication No. 11-225440, Publication Date: Aug. 17, 1999 (1 Page).

* cited by examiner

DETECTION DEVICE AND METHOD, AND PROGRAM

TECHNICAL FIELD

The present invention relates to a detection device and method, and a program. In particular, the invention relates to a detection device and method, and a program, suitable for use in detection of electric power states in facilities equipped with a private power generation system.

BACKGROUND ART

In recent years, together with prevalence of solar-light power generation systems as well as a start of an excess-power wholesale purchase system for solar-light power generation systems, there have been growing needs, also in ordinary homes, for knowing generated power and sold power (excess power) of a solar-light power generation system, purchased power from commercial power supplies, power consumption within homes, and the like.

Conventionally, there have been proposed techniques for detecting which is a currently running state, one state that excess power of a private power generation system, such as a solar-light power generation system, is being supplied to a commercial power supply side as is regarded as an electric power selling state (hereinafter, referred to as power selling state) or the other state that electric power is being supplied from a commercial power supply as is regarded as an electric power purchasing state (hereinafter, referred to as power purchasing state) (see, e.g., Patent Literatures 1 to 3). The inventions of Patent Literatures 1 to 3 include the steps of measuring voltage and current of an electric power line on the commercial power supply side, calculating an electric power from the measured voltage and current, detecting a direction of power flow based on a sign (positive or negative) of the calculated power, and making a decision as to which of the power purchasing state and the power selling state is the currently running state.

CITATION LIST

Patent Literature

PTL1: JP 2004-279321 A
PTL2: JP 2004-297959 A
PTL3: JP H11-225440 A

SUMMARY

In order to measure the voltage of the electric power line on the commercial power supply side (hereinafter, referred to as commercial power line) in ordinary homes, it is necessary to insert an exclusive measuring instrument directly into the commercial power line.

However, such a measuring instrument is under demands for high safety and reliability so as to involve high manufacturing cost. Further, there arises a need for installation work of the measuring instrument, involving occurrence of power interruption during the work. Moreover, the qualification for registered Second-Class or higher electricians is required for the installation work, and no ordinary people are permitted to do. As a result, it has been the case that increased labor, costs and the like make it hardly achievable to introduce equipment for detecting the power state in home.

One or more embodiments of the present invention detects power states with simplicity and low cost.

In a first aspect of the invention, there is provided a detection device for detecting a state of electric power, comprising:

a first current transformer for measuring a first current on a first power line side of a connecting point between a first power line derived from a commercial power supply and a second power line derived from power generation means which supplies electric power equal in frequency to the commercial power supply;

a second current transformer for measuring a second current on a second power line side of the connecting point;

first calculation means for calculating a decision value based on a product of a measured value of the first current and a measured value of the second current; and detection means for detecting a power flow direction of electric power of the first power line based on the decision value.

In the detection device according to the first aspect of the invention, a first current is measured on the first power line side of the connecting point between the first power line derived from the commercial power supply and the second power line derived from the power generation means that supplies electric power having a frequency equal to that of the commercial power supply, a second current is measured on the second power line side of the connecting point, a decision value is calculated based on a product of a measured value of the first current and a measured value of the second current, and a power flow direction of the electric power of the first power line is detected based on the decision value.

Therefore, it becomes implementable to detect a power flow direction of electric power on the commercial power supply side with simplicity and low cost.

The first calculation means is made up of, for example, an analog multiplication circuit or counting circuit, a digital arithmetic circuit, a microcomputer or various types of processors, and the like. The detection means is made up of, for example, a comparison circuit or decision circuit using an operational amplifier or the like, a digital arithmetic circuit, a microcomputer or various types of processors, and the like.

In an embodiment, the first calculation means calculates, as the decision value, a cumulated value of the products during n cycles (where n is a natural number) of the electric power of the commercial power supply.

In this case, detection accuracy for the power flow direction of electric power on the commercial power supply side is improved.

In an embodiment, the first calculation means calculates, as the decision value, a product of a measured value of the first current and a measured value of the second current at a point when the second current reaches a positive or negative peak.

In this case, the detection accuracy for the power flow direction of electric power on the commercial power supply side with a capacitive load connected thereto is improved.

An embodiment further comprises second calculation means for, based on a measured value of the first current and a power flow direction of electric power of the first power line, calculating a first electric power supplied from the commercial power supply to the first power line and a second electric power supplied from the power generation means to the first power line.

In this case, a sold power by the private power generation system and a purchased power from the commercial power supply can be measured with simplicity and low cost.

The second calculation means is made up of, for example, a digital arithmetic circuit, a microcomputer or various types of processors, and the like. The first electric power is, for example, the purchased power, and the second electric power is, for example, the sold power.

In an embodiment, based on a measured value of the first current, a measured value of the second current and a power flow direction of electric power of the first power line, the second calculation means further calculates a third electric power supplied to a load connected to the connecting point.

In this case, power consumption for a load can be measured with simplicity and low cost.

The third electric power is, for example, a power consumption.

An embodiment further comprises display means for displaying the first electric power and the second electric power.

In this case, the user is allowed to easily grasp the sold power and the purchased power.

The display means is made up of, for example, various types of display units, various types of light-emitting devices, and the like.

An embodiment further comprises communication means for transmitting, to outside, information including at least one combination of a combination of the first electric power and the second electric power and another combination of a measured value of the first current and a power flow direction of electric power of the first power line.

In this case, a detected state of electric power can be notified to the outside.

The communication unit is implemented by, for example, wired or wireless various types of communication devices.

In the first aspect of the present invention, there is provided a detection method comprising the following steps, to be performed by a detection device for detecting a state of electric power, of:

a measurement step for measuring a first current by a first current transformer on a first power line side of a connecting point between a first power line derived from a commercial power supply and a second power line derived from power generation means which supplies electric power equal in frequency to the commercial power supply, and measuring a second current by a second current transformer on a second power line side of the connecting point;

a calculation step for calculating a decision value based on a product of a measured value of the first current and a measured value of the second current; and a detection step for detecting a power flow direction of electric power of the first power line based on the decision value.

In the detection method according to the first aspect of the invention, a first current is measured on the first power line side of the connecting point between the first power line derived from the commercial power supply and the second power line derived from the power generation means that supplies electric power having a frequency equal to that of the commercial power supply, a second current is measured on the second power line side of the connecting point, a decision value is calculated based on a product of a measured value of the first current and a measured value of the second current, and a power flow direction of the electric power of the first power line is detected based on the decision value.

Therefore, it becomes implementable to detect a power flow direction of electric power on the commercial power supply side with simplicity and low cost.

This calculation step is executed by, for example, an analog multiplication circuit or counting circuit, a digital arithmetic circuit, a microcomputer or various types of processors, and the like. The detection step is executed by, for example, a comparison circuit or decision circuit using an operational amplifier or the like, a digital arithmetic circuit, a microcomputer or various types of processors, and the like.

In a second aspect of the invention, there is provided a detection device comprising:

calculation means for calculating a decision value based on a product of a measured value of a first current and a measured value of a second current, where the first current is measured by a first current transformer on a first power line side of a connecting point between a first power line derived from a commercial power supply and a second power line derived from power generation means which supplies electric power equal in frequency to the commercial power supply, and where the second current is measured by a second current transformer on a second power line side of the connecting point; and detection means for detecting a power flow direction of electric power of the first power line based on the decision value.

In the detection device according to the second aspect of the invention, a decision value is calculated based on a product of a measured value of a first current and a measured value of a second current, where the first current is measured by the first current transformer on the first power line side of the connecting point between the first power line derived from the commercial power supply and the second power line derived from the power generation means that supplies electric power having a frequency equal to that of the commercial power supply, and where the second current is measured by the second current transformer on the second power line side of the connecting point, and then a power flow direction of electric power of the first power line is detected based on the decision value.

Therefore, it becomes implementable to detect a power flow direction of electric power on the commercial power supply side with simplicity and low cost.

The calculation means is made up of, for example, an analog multiplication circuit or counting circuit, a digital arithmetic circuit, a microcomputer or various types of processors, and the like. The detection means is made up of, for example, a comparison circuit or decision circuit using an operational amplifier or the like, a digital arithmetic circuit, a microcomputer or various types of processors, and the like.

In the second aspect of the invention, there is provided a detection method comprising the following steps, to be performed by a detection device for detecting a state of electric power, of:

a calculation step for calculating a decision value based on a product of a measured value of a first current and a measured value of a second current, where the first current is measured by a first current transformer on a first power line side of a connecting point between a first power line derived from a commercial power supply and a second power line derived from power generation means which supplies electric power equal in frequency to the commercial power supply, and where the second current is measured by a second current transformer on a second power line side of the connecting point; and a detection step for detecting a power flow direction of electric power of the first power line based on the decision value.

In the detection method according to the second aspect of the invention, a decision value is calculated based on a product of a measured value of a first current and a measured value of a second current, where the first current is measured by the first current transformer on the first power line side of the connecting point between the first power line derived from the commercial power supply and the second power line derived from the power generation means that supplies electric power having a frequency equal to that of the commercial power supply, and where the second current is measured by the second current transformer on the second power line side of the connecting point, and then a power flow direction of electric power of the first power line is detected based on the decision value.

Therefore, it becomes implementable to detect a power flow direction of electric power on the commercial power supply side with simplicity and low cost.

This calculation step is executed by, for example, an analog multiplication circuit or counting circuit, a digital arithmetic circuit, a microcomputer or various types of processors, and the like. The detection step is executed by, for example, a comparison circuit or decision circuit using an operational amplifier or the like, a digital arithmetic circuit, a microcomputer or various types of processors, and the like.

In the second aspect of the invention, there is provided a program for executing the following steps, to be performed by a computer, of:

a calculation step for calculating a decision value based on a product of a measured value of a first current and a measured value of a second current, where the first current is measured by a first current transformer on a first power line side of a connecting point between a first power line derived from a commercial power supply and a second power line derived from power generation means which supplies electric power equal in frequency to the commercial power supply, and where the second current is measured by a second current transformer on a second power line side of the connecting point; and a detection step for detecting a power flow direction of electric power of the first power line based on the decision value.

In a computer that executes the program according to the second aspect of the invention, a decision value is calculated based on a product of a measured value of first current and a measured value of a second current, where the first current is measured by the first current transformer on the first power line side of the connecting point between the first power line derived from the commercial power supply and the second power line derived from the power generation means that supplies electric power having a frequency equal to that of the commercial power supply, and where the second current is measured by the second current transformer on the second power line side of the connecting point, and then a power flow direction of electric power of the first power line is detected based on the decision value.

Therefore, it becomes implementable to detect a power flow direction of electric power on the commercial power supply side with simplicity and low cost.

According to the first or second aspect of the invention, it becomes implementable to detect the state of electric power with simplicity and low cost.

DETAILED DESCRIPTION

Embodiments of the present invention will be described hereinbelow. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. The description will be given in the following order:

1. Embodiments
2. Modification
1. <Embodiments>
(Configuration Example of Power Monitoring System)

Figure 1:
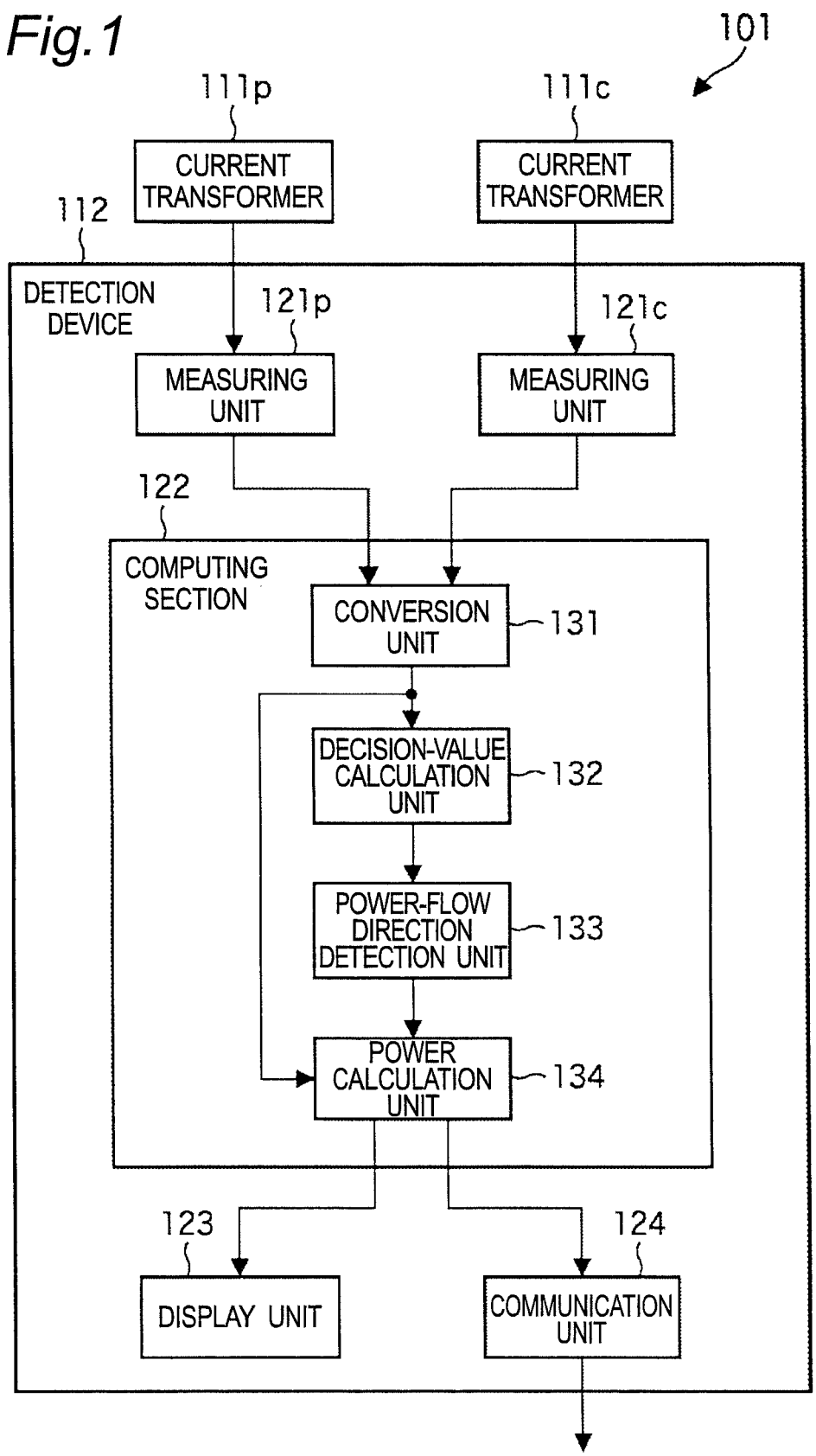
FIG. 1 is a block diagram showing a power monitoring system to which one or more embodiments of the invention is applied.
Figure 2:
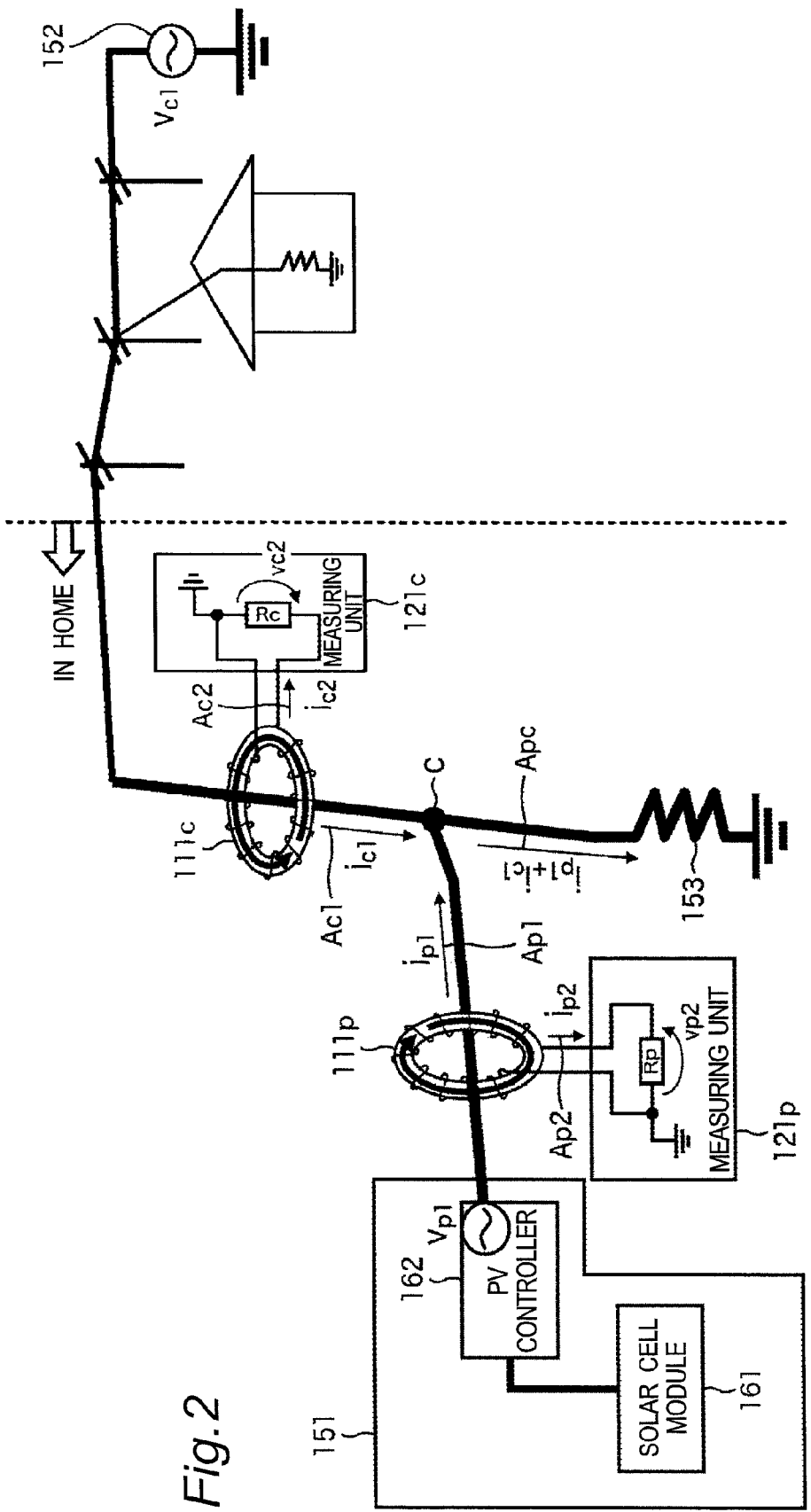
FIG. 2 is a view showing an example of set positions of current transformers.

FIG. 1 is a block diagram showing a power monitoring system 101 to which one or more embodiments of the invention is applied. FIG. 2 shows an example of set positions of current transformers 111$p$, 111$c$ in the power monitoring system 101.

Hereinafter, the left side of a broken line in FIG. 2 will be assumed as the interior of a home in which the power monitoring system 101 and a solar-light power generation system 151 are provided. Also hereinafter, an electric power line ranging from the solar-light power generation system 151 to a connecting point C will be referred to as power-generation power line, an electric power line ranging from a commercial power supply 152 to the connecting point C will be referred to as commercial power line, and an electric power line ranging from the connecting point C to a load 153 will be referred to as load power line. In addition, hereinafter, it is assumed that every power line within the home interior is formed from a single-phase two-wire system.

Further, hereinafter, it is assumed that a voltage of the power-generation power line (=output voltage of the solar-light power generation system 151) is $v_{p1}$ its current is $i_{p1}$, and a direction of arrow Ap1 is a positive direction. It is also assumed, hereinafter, that a voltage of the commercial power line (=output voltage of the commercial power supply 152) is $v_{c1}$, its current is $i_{c1}$, and a direction of arrow Ac1 is a positive direction. Accordingly, in the load power line, a current of $i_{p1}+i_{c1}$ flows in the direction of arrow Apc.

The power monitoring system 101 is a system for detecting and monitoring the power state of home interior. The power monitoring system 101, as will be described later, detects a power flow direction of an electric power of the commercial power line (hereinafter, referred to as commercial-side power) based on a current $i_{p1}$ and a current $i_{c1}$ to decide whether the currently running state is a power purchasing state or a power selling state. The power monitoring system 101 also measures a generated power of the solar-light power generation system 151 as well as a sold power which is an excess power of the solar-light power generation system 151 and which is supplied from the solar-light power generation system 151 to the commercial power line. Further, the power monitoring system 101 measures a purchased power supplied from the commercial power supply 152 to the commercial power line as well as a power consumption of powers which are supplied from the solar-light power generation system 151 and the commercial power supply 152 to the load power line and which are consumed by the load 153.

The solar-light power generation system 151 is made up so as to include a solar cell module 161 and a PV (Photo Voltatic) controller 162.

The solar cell module 161 generates DC power by solar-light power generation and supplies the generated DC power to the PV controller 162.

The PV controller 162 converts the DC power derived from the solar cell module 161 into an AC power nearly equal in voltage and frequency to that of the commercial power supply 152 and moreover synchronizes a phase of the converted AC power with a phase of the voltage of the commercial power supply 152. Then, the PV controller 162 outputs the AC power (hereinafter, referred to as generated power).

The load 153 is given by various types of electrical equipment such as refrigerator or other electrical appliances.

The connecting point C is a point at which the power-generation power line and the commercial power line merge together and from which the load power line is branched. The connecting point C corresponds to, for example, a distribution board in home.

Now construction of the power monitoring system 101 will be described in more detail below.

The power monitoring system 101 is made up so as to include the current transformer 111p, the current transformer 111c and a detection device 112. The detection device 112 is made up so as to include a measuring unit 121p, a measuring unit 121c, a computing section 122, a display unit 123, and a communication unit 124.

The current transformer 111p is placed on an interconnecting line between the solar-light power generation system 151 and the connecting point C so as to measure the current $i_{p1}$ of the power-generation power line. More specifically, the current transformer 111p transforms the current $i_{p1}$ (primary current) into a current $i_{p2}$ (secondary current) and supplies the transformed current to the measuring unit 121p. In addition, hereinafter, the current transformer 111p is so set that the current $i_{p2}$ flows in a direction of arrow Ap2 when the current $i_{p1}$ flows in the direction of arrow Ap1.

The measuring unit 121p converts the current $i_{p2}$ into a voltage $v_{p2}$ by means of a built-in resistor Rp. In addition, the voltage $v_{p2}$ becomes a positive value when the current $i_{p1}$ flows in the direction of arrow Ap1 and the current $i_{p2}$ flows in the direction of arrow Ap2, and the voltage $v_{p2}$ becomes a negative value when the current $i_{p1}$ flows in a direction reverse to the arrow Ap1 and the current $i_{p2}$ flows in a direction reverse to the arrow Ap2. That is, with the direction of arrow Ap1 assumed as positive, a phase of the current $i_{p1}$ and a phase of the voltage $v_{p2}$ coincide with each other.

The measuring unit 121p also supplies a signal showing the voltage $v_{p2}$ (hereinafter, referred to as signal $v_{p2}$) to the computing section 122.

The current transformer 111c is placed on an interconnecting line in the home interior between the commercial power supply 152 and the connecting point C so as to measure the current $i_{c1}$ of the commercial power line. More specifically, the current transformer 111c transforms the current $i_{c1}$ (primary current) into a current $i_{c2}$ (secondary current) and supplies the transformed current to the measuring unit 121c. In addition, hereinafter, the current transformer 111c is so set that the current $i_{c2}$ flows in the direction of arrow Ac2 when the current $i_{c1}$ flows in the direction of arrow Ac1.

The measuring unit 121c converts the current $i_{c2}$ into a voltage $v_{c2}$ by means of a built-in resistor Rc. In addition, the voltage $v_{c2}$ becomes a positive value when the current $i_{c1}$ flows in the direction of arrow Ac1 and the current $i_{c2}$ flows in the direction of arrow Ac2, and the voltage $v_{c2}$ becomes a negative value when the current $i_{c1}$ flows in a direction reverse to the arrow Ac1 and the current $i_{c2}$ flows in a direction reverse to the arrow Ac2. That is, with the direction of arrow Ac1 assumed as positive, a phase of the current $i_{c1}$ and a phase of the voltage $v_{c2}$ coincide with each other.

Also, in the power purchasing state in which the commercial-side power is supplied in the direction of arrow Ac1, a difference between the phase of the voltage $v_{c1}$ and the phase of the voltage $v_{c2}$ (=phase of current $i_{c1}$) falls within a range of $-\pi/2$ to $+\pi/2$ even in consideration of the power factor of the load 153 and the phase locking error of the PV controller 162. Conversely, in the power selling state in which the commercial-side power is supplied in the direction reverse to the arrow Ac1, the difference between the phase of the voltage $v_{c1}$ and the phase of the voltage $v_{c2}$ (=phase of current $i_{c1}$) falls within a range from $-\pi$ to $-\pi/2$ or a range from $\pi/2$ to $\pi$. In addition, as will be described later, it is empirically known that the power factor of a general load for household use falls under a range of $\cos(\pi/6)$ or lower.

The measuring unit 121c also supplies a signal showing the voltage $v_{c2}$ (hereinafter, referred to as signal $v_{c2}$) to the computing section 122.

The computing section 122, which is implemented by a microcomputer as an example, is made up so as to include a conversion unit 131, a decision-value calculation unit 132, a power-flow direction detection unit 133, and a power calculation unit 134.

Based on a known current-transformation ratio of the current transformer 111p as well as a resistance value of the resistor Rp, the conversion unit 131 converts a value of the voltage $v_{p2}$ shown by the signal $v_{p2}$ into a value of the current $i_{p1}$, and notifies the decision-value calculation unit 132 and the power calculation unit 134 of the converted value. Also, based on a known current-transformation ratio of the current transformer 111c as well as a resistance value of the resistor Rc, the conversion unit 131 converts a value of the voltage $v_{c2}$ shown by the signal $v_{c2}$ into a value of the current $i_{c1}$, and notifies the decision-value calculation unit 132 and the power calculation unit 134 of the converted value.

As will be described later, the decision-value calculation unit 132 calculates a decision value used for detection of a power flow direction of the commercial-side power based on a measured value of the current $i_{p1}$ and a measured value of the current $i_{c1}$. The decision-value calculation unit 132 notifies the power-flow direction detection unit 133 of the calculated decision value.

Based on a decision value calculated by the decision-value calculation unit 132 as will be described later, the power-flow direction detection unit 133 detects a power flow direction of the commercial-side power and notifies the power calculation unit 134 of a detection result.

Based on a measured value of the current $i_{p1}$, a measured value of the current $i_{c1}$ and a detection result of the power flow direction of the commercial-side power, the power calculation unit 134, as will be described later, calculates a generated power, a sold power, a purchased power and a power consumption. The power calculation unit 134 notifies the display unit 123 and the communication unit 124 of a calculation result.

The display unit 123 is implemented by, for example, an LCD (Liquid Crystal Display) or other display device, an LED (Light Emitting Diode) or other light emitting device, or the like and acts to display power states of individual parts.

The communication unit 124 is implemented by, for example, any one among various types of communication devices and acts to transmit power-state information, which shows power states of individual parts, to external devices. It is noted that a communication method of the communication unit 124 may be any one, whether it is wired or wireless.

(Power Monitoring Process)

Next, power monitoring process to be executed by the power monitoring system 101 will be described with reference to the flowchart of FIG. 3. This process is started when the power monitoring system 101 is turned on, and terminated when the power monitoring system 101 is turned off, as an example.

At step S1, the power monitoring system 101 measures currents. More specifically, the current transformer 111$p$ transforms a current $i_{p1}$ flowing in the power-generation power line into a current $i_{p2}$, and supplies the transformed current to the measuring unit 121$p$. The measuring unit 121$p$ converts the current $i_{p2}$ into a voltage $v_{p2}$, and supplies a signal $v_{p2}$ showing the voltage $v_{p2}$ to the conversion unit 131. Also, the current transformer 111$c$ transforms a current $i_{c1}$ flowing in the commercial power line into a current $i_{c2}$, and supplies the transformed current to the measuring unit 121$c$. The measuring unit 121$c$ converts the current $i_{c2}$ into a voltage $v_{c2}$, and supplies a signal $v_{c2}$ showing the voltage $v_{c2}$ to the conversion unit 131.

The conversion unit 131 converts the value of the voltage $v_{p2}$ shown by the signal $v_{p2}$ into a value of the current $i_{p1}$, and notifies the decision-value calculation unit 132 and the power calculation unit 134 of the converted value. Also, the conversion unit 131 converts a value of the voltage $v_{c2}$ shown by the signal $v_{c2}$ into a value of the current $i_{c1}$, and notifies the decision-value calculation unit 132 and the power calculation unit 134 of the converted value.

At step S2, the decision-value calculation unit 132 calculates a decision value, and notifies the power-flow direction detection unit 133 of the calculated decision value.

At step S3, based on the decision value, the power-flow direction detection unit 133 detects a power flow direction of the commercial-side power, and notifies the power calculation unit 134 of the detected power flow direction.

Here is explained a concrete example of the decision value and the detection method for the power flow direction of the commercial-side power in the process of steps S2 and S3 with reference to FIGS. 4 to 9.

For example, in a case where the measurements of the current $i_{p1}$ and the current $i_{c1}$ are performed successively by analog circuits or the like, a decision value V1 determined by the following Equation (1) as an example is used:

$$V1 = \int_{t=0}^{t=T} i_{p1}(t) \times i_{c1}(t) dt \qquad (1)$$

It is noted that time T represents a one-cycle time (=1/frequency of commercial power supply 152) of power of the commercial power supply 152.

The decision value V1 is a value obtained by cumulatively counting, for a period of one cycle, a product of an instantaneous value of the current $i_{p1}$ and an instantaneous value of the current $i_{c1}$ taken at a generally simultaneous time point. Therefore, given a phase $\phi p$ of the current $i_{p1}$ and a phase $\phi c$ of the current $i_{c1}$, it follows that decision value $V1 \geq 0$ for $|\phi p - \phi c| \leq \pi/2$ while decision value $V1 < 0$ for $\pi/2 < |\phi p - \phi c| \leq \pi$.

As described above, it is empirically known that the power factor of a general load for household use falls under a range of $\cos(\pi/6)$ or lower.

Figure 4:
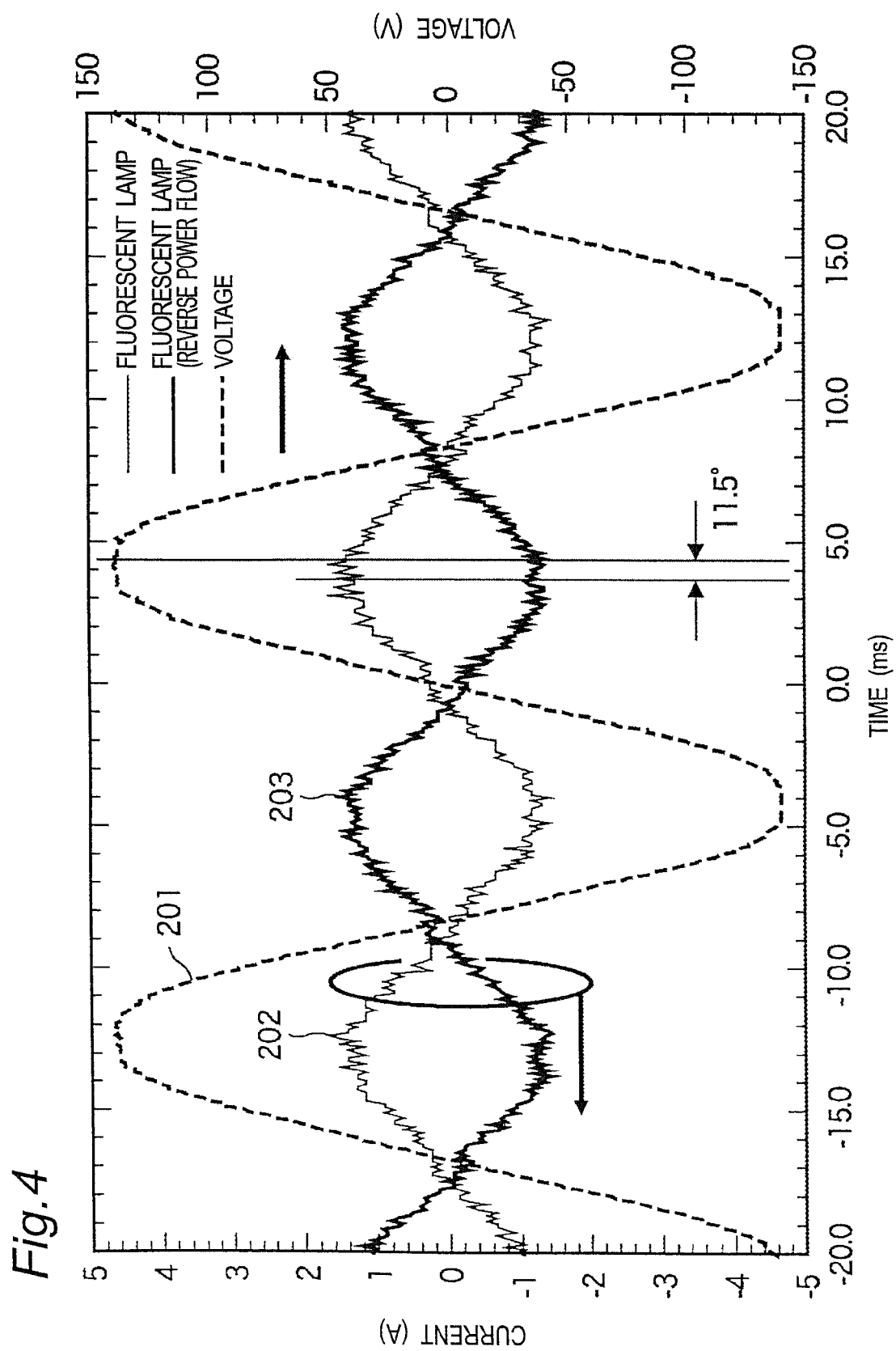
FIG. 4 is a graph showing an example of voltage-current phase differences due to loads.

For example, FIG. 4 is a graph showing a result of measuring currents by current transformers with an AC voltage of 100 V applied to a fluorescent lamp. In FIG. 4, the horizontal axis shows time while the vertical axis shows voltage and current. A waveform 201 shows a voltage waveform, a waveform 202 shows a current waveform obtained by a current transformer set in such a direction that the current value becomes positive with the voltage and the current in phase, and a waveform 203 shows a current waveform obtained by a current transformer set in such a direction that the current value becomes positive with the voltage and the current in opposite phase. In this case, a phase difference between the voltage applied to the fluorescent lamp and the current flowing through the fluorescent lamp becomes about 11.5 degrees ($<\pi/6$).

Figure 5:
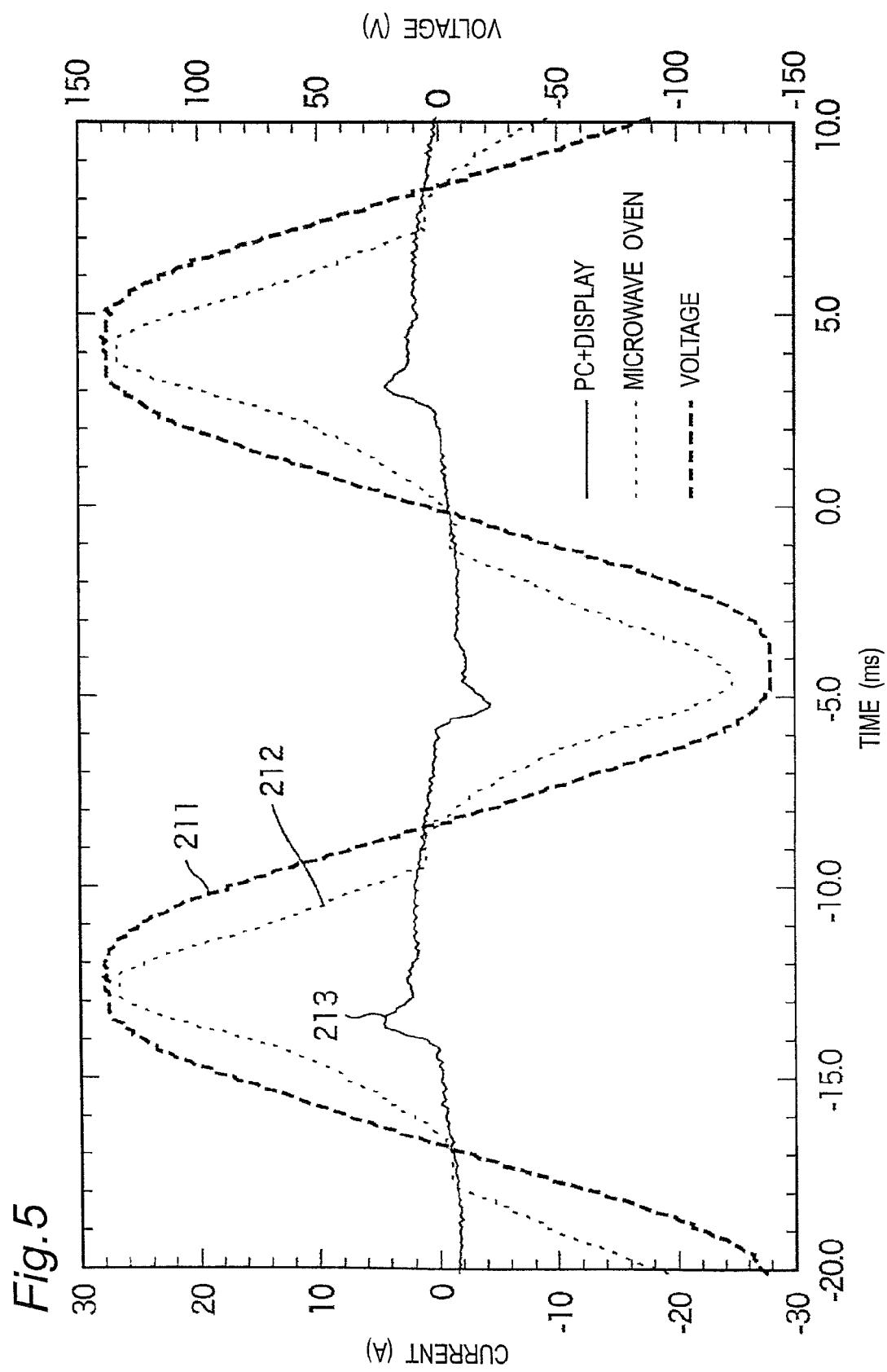
FIG. 5 is a graph showing another example of voltage-current phase differences due to loads.

Also, FIG. 5 is a graph showing a result of measuring a current by a current transformer with an AC voltage of 100 V applied to another load, where the current transformer is set in such a direction that the current value becomes positive with the voltage and the current in phase. In FIG. 5, the horizontal axis shows time while the vertical axis shows voltage and current. A waveform 211 shows a voltage waveform, a waveform 212 shows a current waveform in a case where the load is a microwave oven, and a waveform 213 shows a current waveform in a case where the loads are a personal computer and a display. In this case also, the voltage-current phase difference is smaller than $\pi/6$.

Accordingly, it can be presumed that the phase difference between the voltage $v_{p1}$ and the current $i_{p1}$ of the power-generation power line becomes within $-\pi/6$ to $+\pi/6$. It can be also presumed that the phase difference between the voltage $v_{c1}$ and the current $i_{c1}$ of the commercial power line becomes within a range of $-\pi/6$ to $+\pi/6$ for the power purchasing state and becomes within a range of $(\pi-\pi/6)$ to $(\pi+\pi/6)$ for the power selling state. As a consequence, in the power purchasing state, it can be presumed that $|\phi p-\phi c| \leq \pi/3$ so that the decision value $V1 \geq 0$. On the other hand, in the power selling state, it can be presumed that $2\pi/3 \leq |\phi p-\phi c| \leq \pi$ so that the decision value $V1<0$.

Therefore, based on the decision value V1, the power flow direction of the commercial-side power can be detected. That is, with the decision value $V1 \geq 0$, it can be decided as the power purchasing state in which the commercial-side power is supplied in the direction of arrow Ac1, while with the decision value $V1<0$, it can be decided as the power selling state in which the commercial-side power is supplied in a direction reverse to the arrow Ac1.

Figure 6:
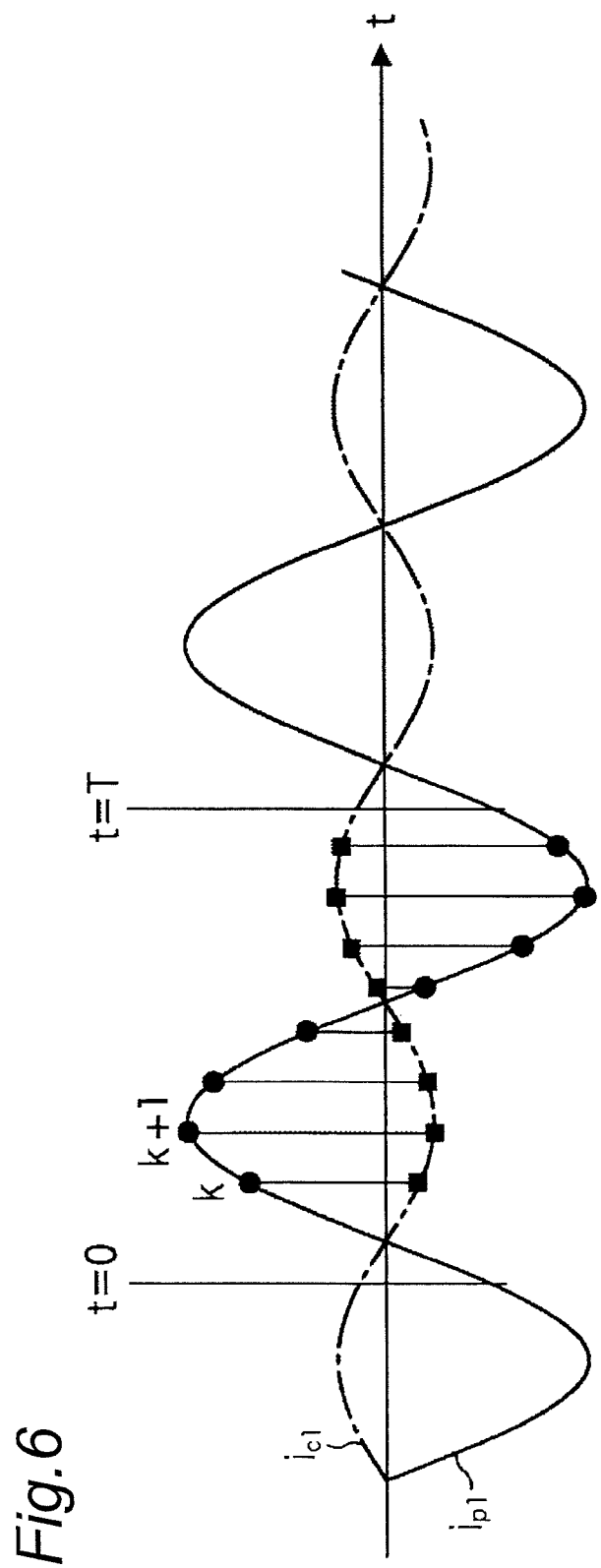
FIG. 6 is a view for explaining a decision value calculating method.

Further, in cases where measurements of the current $i_{p1}$ and the current $i_{c1}$ are performed discretely by digital arithmetic circuits or the like as an example as shown in FIG. 6, a decision value V2 determined by the following Equation (2) is used:

$$V2 = \sum_{k=0}^{m} i_{p1}[k] \times i_{c1}[k] \qquad (2)$$

FIG. 6 shows examples of waveforms of the current $i_{p1}$ and the current $i_{c1}$ in the power selling state, where the horizontal axis shows the time and the vertical axis shows the current value. Round marks and square marks in FIG. 6 denote sampling points, where only part of the sampling points are shown in FIG. 6 for an easier understanding of the chart.

Character 'k' in Equation (2) denotes a number of a sampling point for the current $i_{p1}$ and the current $i_{c1}$, and 'm' denotes a number of sampling times per cycle. Further, character $i_{p1}[k]$ denotes a sampling value of the current $i_{p1}$ at the k-th sampling point, and character $i_{c1}[k]$ denotes a sampling value of the current $i_{c1}$ at the k-th sampling point.

The decision value V2 is a value obtained by cumulatively counting, for a period of one cycle, a product of sampling values of the current $i_{p1}$ and the current $i_{c1}$ taken at a generally simultaneous time point. Accordingly, as in the case of the decision value V1, it results that the decision value $V2 \geq 0$ on condition that $|\phi p-\phi c| \leq \pi/2$ while the decision value $V2<0$ on condition that $\pi/2 < |\phi p-\phi c| \leq \pi$.

Consequently, as in the case of use of the decision value V1, it can be decided as the power purchasing state when the decision value $V2 \geq 0$, and as the power selling state when the decision value $V2<0$.

Figure 7:
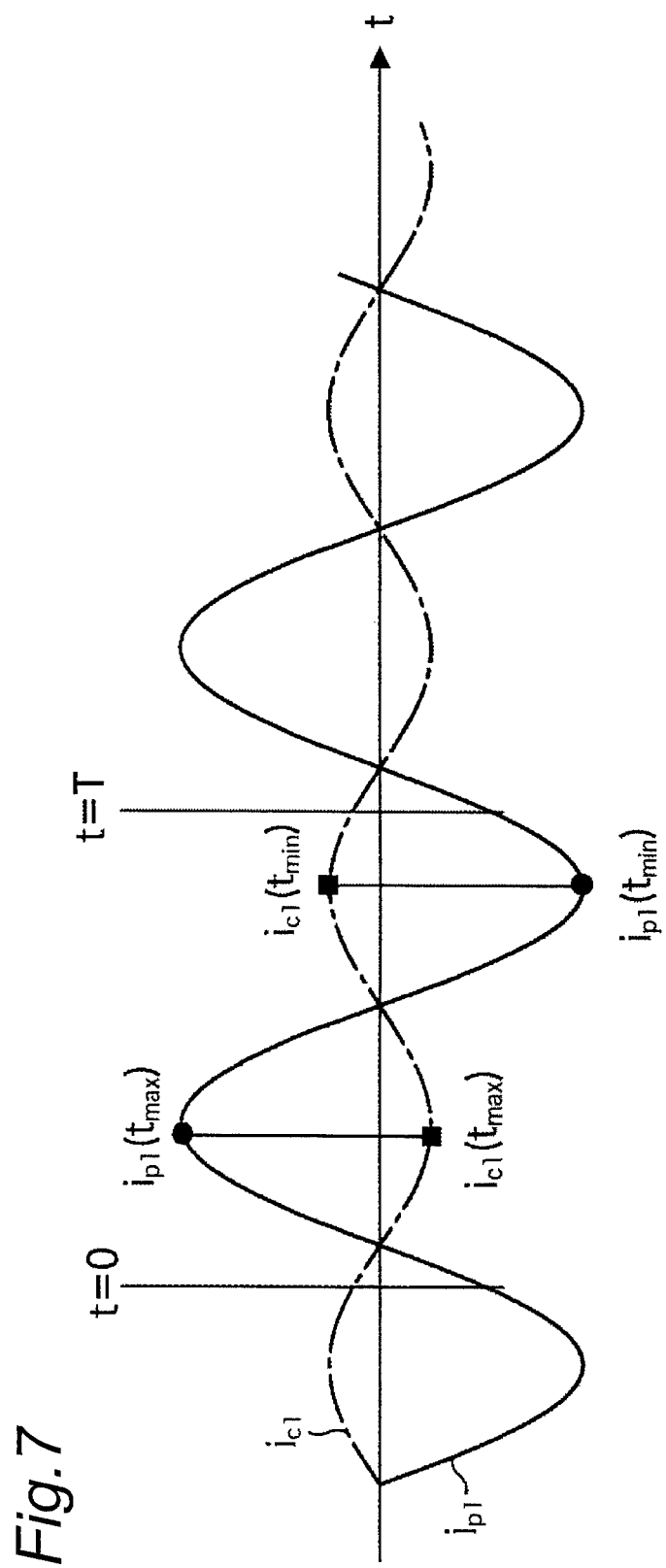
FIG. 7 is a view for explaining a decision value calculating method.

Further, for example, as shown in FIG. 7, assuming that a value of the current $i_{p1}$ is $i_{p1}(t_{max})$ and a value of the current $i_{c1}$ is $i_{c1}(t_{max})$ at a time $t_{max}$ when the current $i_{p1}$ reaches a positive peak, it is also allowable to use a decision value V3 determined by the following Equation (3):

$$V3 = i_{p1}(t_{max}) \times i_{c1}(t_{max}) \qquad (3)$$

In this case also, as in the case of use of the decision value V1, it can be decided as the power purchasing state when the decision value $V3 \geq 0$, and as the power selling state when the decision value $V3<0$.

Similarly, with use of a value $i_{p1}(t_{min})$ of the current $i_{p1}$ and a value $i_{c1}(t_{min})$ of the current $i_{c1}$ at a time $t_{min}$ when the current $i_{p1}$ reaches a negative peak, it is also allowable to use a decision value V4 determined by the following Equation (4):

$$V4 = i_{p1}(t_{min}) \times i_{c1}(t_{min}) \qquad (4)$$

In this case also, as in the case of use of the decision value V3, it can be decided as the power purchasing state when the decision value $V4 \geq 0$, and as the power selling state when the decision value $V4<0$.

Figure 8:
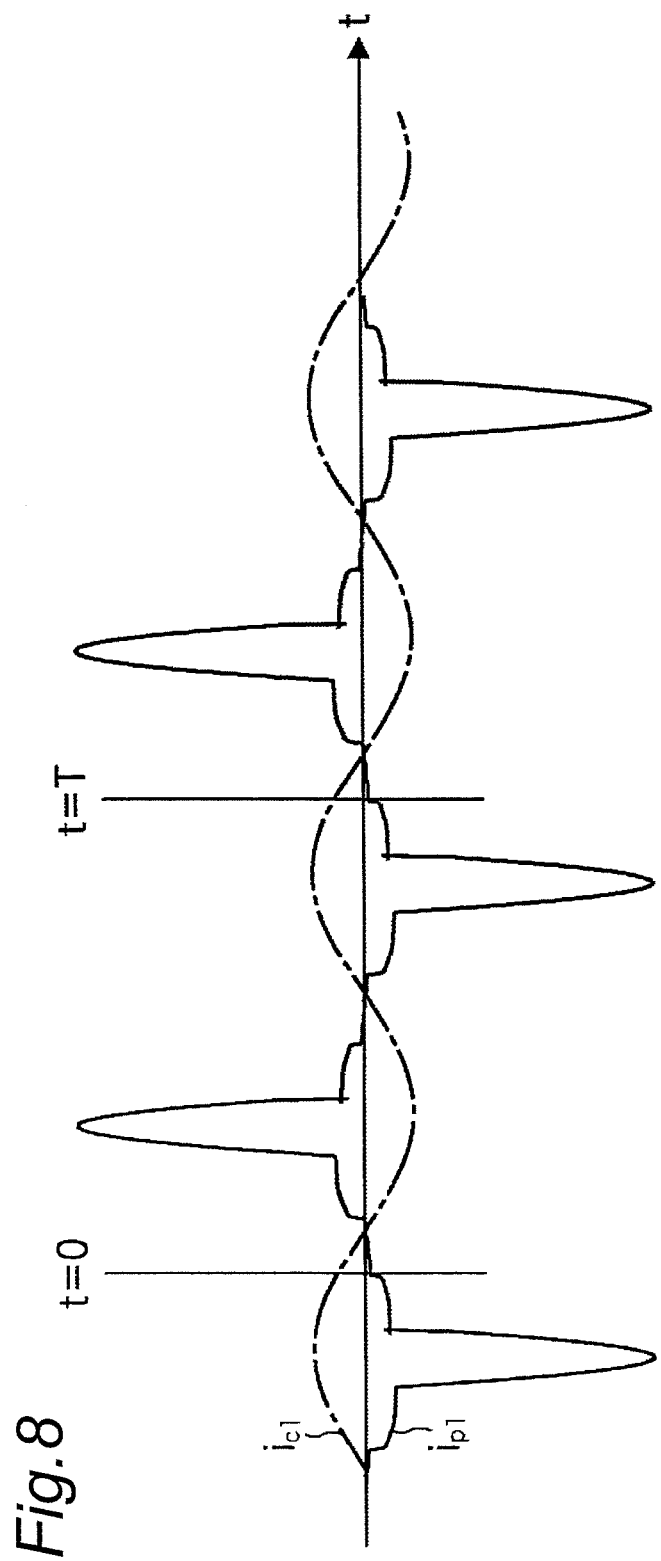
FIG. 8 is a graph showing an example of current waveforms with a capacitive load connected.

FIG. 8 shows an example of waveforms of the current $i_{p1}$ and the current $i_{c1}$ in the power selling state in a case where the load 153 is composed mostly of a capacitive load (capacitor load). The horizontal axis shows the time and the vertical axis shows the current.

As shown in this figure, with the load 153 composed mostly of a capacitive load, the current $i_{p1}$ of the power-generation power line comes in a pulsed waveform in which short-time sharp peaks appear. In this case, it may occur that the power flow direction of the commercial-side power can be detected at higher accuracy with the use of the decision value V3 or decision value V4 which is a product of the current $i_{p1}$ and the current $i_{c1}$ for time points at which the current $i_{p1}$ of the power-generation power line comes to a peak, than with the use of the decision value V1 or decision value V2 obtained by cumulatively counting a product of the current $i_{p1}$ and the current $i_{c1}$ for a period of one cycle.

Also, in cases where the current $i_{p1}$ and the current $i_{c1}$ cannot be measured simultaneously for short sampling intervals or other reasons, a decision value may also be calculated, for example, by using a current $i_{p1}$ and a current $i_{c1}$ measured for different cycles.

For instance, when measurements of the current $i_{p1}$ and the current $i_{c1}$ are performed successively, a decision value V5 determined by the following Equation (5) is used:

$$V5 = \int_{t=0}^{t=T} i_{p1}(t) \times i_{c1}(t+nT)dt \qquad (5)$$

where n in Equation (5) is an natural number.

The decision value V5 is a value obtained by cumulatively counting, for a period of one cycle, a product of an instantaneous value of the current $i_{p1}$ and an instantaneous value of the n-cycle delayed current $i_{c1}$. Accordingly, as in the case of use of the decision value V1, it can be decided as the power purchasing state when the decision value $V5 \geq 0$, and as the power selling state when the decision value $V5<0$.

Moreover, for example, when measurements of the current $i_{p1}$ and the current $i_{c1}$ are performed discretely, a decision value V6 determined by the following Equation (6) is used:

$$V6 = \sum_{k=0}^{m} i_{p1}[k] \times i_{c1}[n \times m + k] \qquad (6)$$

Figure 9:
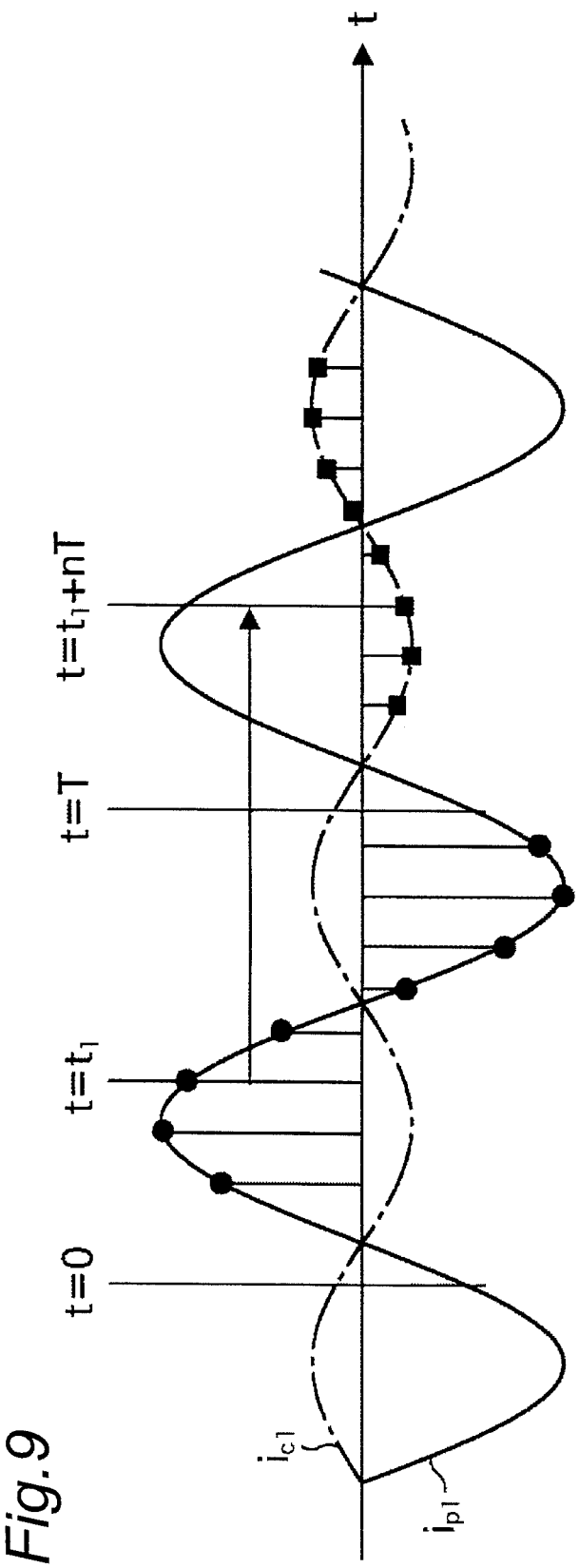
FIG. 9 is a view for explaining a decision value calculating method.

As shown in FIG. 9, the decision value V6 is a value obtained by cumulatively counting, for a period of one cycle, a product of a sampling value of the current $i_{p1}$ and a sampling value of the n-cycle delayed current $i_{c1}$. Accordingly, as in the case of use of the decision value V1, it can be decided as the power purchasing state when the decision value $V6 \geq 0$, and as the power selling state when the decision value $V6<0$.

Figure 3:
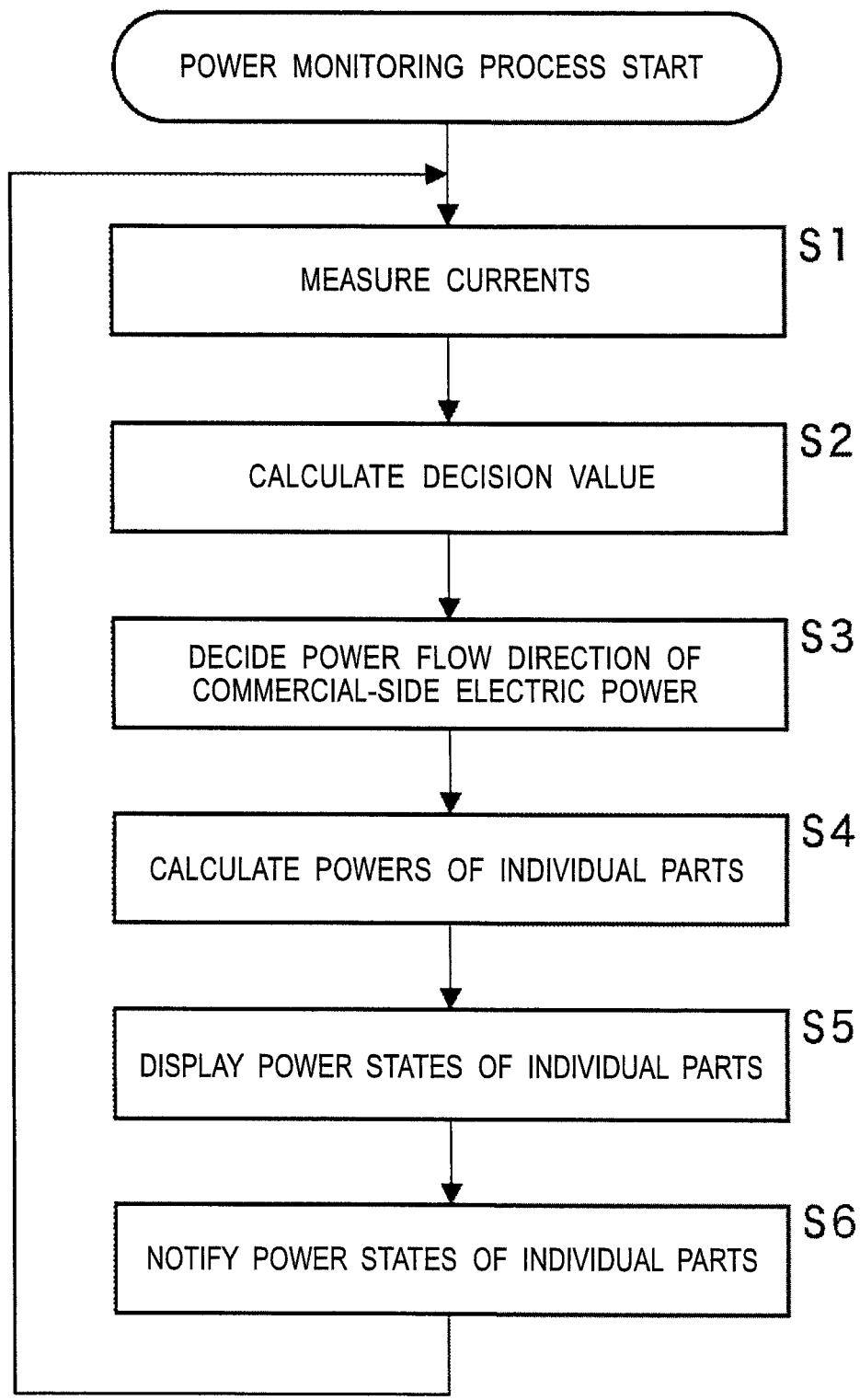
FIG. 3 is a flowchart for explaining power monitoring process.

Reverting to FIG. 3, at step S4, the power calculation unit 134 calculates powers of individual parts. More specifically, given a generated power $P_p$ of the solar-light power generation system 151, the power calculation unit 134 calculates the generated power $P_p$ by the following Equation (7):

$$P_p = vr_{p1} \times ir_{p1} \times PF_p \qquad (7)$$

where $vr_{p1}$ represents an effective value of the voltage $v_{p1}$ and, for example, a nominal value of the output voltage of the solar-light power generation system 151 is used therefor. Instead, a measured value of the effective value of the voltage $v_{p1}$ may be acquired from the solar-light power generation system 151.

Denotation '$ir_{p1}$' represents an effective value of the current $i_{p1}$, which is calculated based on a measured value of the current $i_{p1}$.

Denotation '$PF_p$' represents a power factor of the power-generation power line, which is a constant to be set based on, for example, an experiment result, an actual measurement result, a theoretical formula, or the like.

Given a purchased power $P_{cb}$ and a sold power $P_{cs}$, in the case where it is decided as the power purchasing state, the power calculation unit 134 calculates the purchased power $P_{cb}$ and the sold power $P_{cs}$ by the following Equation (8) and Equation (9):

$$P_{cb}=vr_{c1} \times ir_{c1} \times PF_c \qquad (8)$$

$$P_{cs}=0 \qquad (9)$$

where $vr_{c1}$ represents an effective value of the voltage $v_{c1}$ and, for example, a nominal voltage of the commercial power supply 152 is used. In addition, since the output voltage of the solar-light power generation system 151 is controlled so as to be equal to the voltage of the commercial power supply 152, a measured value of the effective value of the voltage $v_{p1}$ may be acquired from the solar-light power generation system 151 and used as the voltage $vr_{c1}$.

Denotation '$ir_{c1}$' represents an effective value of the current $i_{c1}$, which is calculated based on a measured value of the current $i_{c1}$.

Denotation '$PF_c$' represents a power factor of the commercial power line, which is a constant to be set based on, for example, an experiment result, an actual measurement result, a theoretical formula, or the like.

Meanwhile, with a decision as the power selling state, the power calculation unit 134 calculates the purchased power $P_{cb}$ and the sold power $P_{cs}$ by the following Equation (10) and Equation (11):

$$P_{cb}=0 \qquad (10)$$

$$P_{cs}=vr_{c1} \times ir_{c1} \times PF_c \qquad (11)$$

where the right side of Equation (8) and the right side of Equation (11) are equal to each other.

Also, with a decision as the power purchasing state, the power calculation unit 134 calculates a load power $P_1$ of the load 153 by the following Equation (12):

$$P_1=vr_{c1} \times (ir_{p1}+ir_{c1}) \times PF_1 \qquad (12)$$

where $PF_1$ represents a power factor of the load power line, which is a constant to be set based on, for example, an experiment result, an actual measurement result, a theoretical formula, or the like.

Meanwhile, with a decision as the power selling state, the power calculation unit 134 calculates the load power $P_1$ of the load 153 by the following Equation (13):

$$P_1=vr_{c1} \times (ir_{p1}-ir_{c1}) \times PF_1 \qquad (13)$$

Then, the power calculation unit 134 notifies the display unit 123 and the communication unit 124 of calculated power values of the individual parts.

At step S5, the display unit 123 displays the power states of the individual parts. For example, the display unit 123 displays the calculated generated power $P_p$, sold power $P_{cs}$, purchased power $P_{cb}$ and power consumption $P_1$ by using numerical values or a time-series chart or the like. Also, the display unit 123 displays whether the current state is a power purchasing state or a power selling state, on the screen by means of characters, signs, icons or the like or shows the same by lighting, blinking, color variations or the like by LED or the like.

As a result, the user is enabled to grasp the power states of the individual parts within the home.

At step S6, the communication unit 124 notifies the power states of the individual parts. More specifically, the communication unit 124 transmits, to an external device, power state information including the calculated generated power $P_p$, sold power $P_{cs}$, purchased power $P_{cb}$ and power consumption $P_1$ as well as whether the current state is a power purchasing state or a power selling state.

The external device destined for transmission performs, for example, accumulation of received information or analysis as to use state of the power or the like based on received information.

Moreover, the power state information may further include measured values of the current $i_{p1}$ and the current $i_{c1}$. Also, it is not necessarily needed to transmit all of the above-described information, and transmitted information may be selected, for example, according to needs of the transmission-destined device.

Further, the transmission of power state information does not need to be done every time in each loop process of power monitoring process and it may be done at a specified timing, for example, at every specified period or each time the accumulated quantity of information exceeds a specified quantity. Otherwise, it is also allowable that the power state information is transmitted by request from the external device.

Thereafter, the processing returns to step S1, followed by execution of the step S1 and followings.

In the way as shown above, without setting a voltage measuring instrument on the power line and with only the current transformers 111p, 111c set on the power line, detection of a power flow direction of the commercial-side power can be achieved only by measuring the current $i_{p1}$ and the current $i_{c1}$. Besides, measurement of generated power, sold power, purchased power and power consumption can also be achieved.

Therefore, it becomes implementable to install the power monitoring system 101 with safety and uninterruption, so that the installation of the power monitoring system 101 is facilitated and moreover necessary costs can be cut down. As a result, power state detection can be achieved simply with low costs. Further, omission of voltage measuring instruments that are required for high safety and reliability allows the safety and reliability of the power monitoring system 101 as a whole to be improved.

<2. Modification>

The description given hereinabove shows an example in which one or more embodiments of the invention is applied to a single-phase two-wire power line. However, one or more embodiments of the invention is applicable also to single-phase three-wire power lines.

Figure 10:
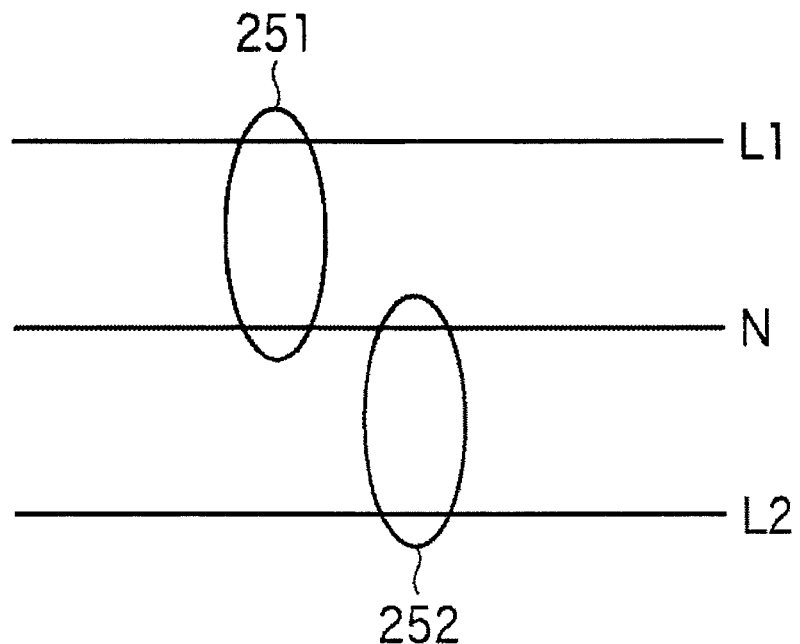
FIG. 10 is a view showing an example of a current transformer setting method for a single-phase three-wire system.

FIG. 10 shows an example of a current transformer setting method for a single-phase three-wire system. As shown in this figure, two current transformers, a current transformer 251 and a current transformer 252, may appropriately be provided between a voltage line L1 and a neutral line N (hereinafter, referred to as L1 phase) and between a voltage line L2 and the neutral line N (hereinafter, referred to as L2 phase), respectively.

In the case of the single-phase three-wire system, when measurements of the current $i_{p1}$ and the current $i_{c1}$ are performed discretely and serially, it is preferable to adopt such a way of current measurement including successions of in-phase currents, which is exemplified by measurement in an order of the current $i_{p1}$ of L1 phase, the current $i_{c1}$ of L1 phase, the current $i_{p1}$ of L2 phase, the current $i_{c1}$ of L2 phase, . . . .

Also, the description given above shows an example in which calculation of the decision values V1, V2, V5 and V6 is done by cumulatively counting a product of the current $i_{p1}$ and the current $i_{c1}$ for a period of one cycle. However, the calculation may be done by cumulatively counting the product for a period of n cycles (where n is a natural number of 2 or more).

Further, the setting direction of the current transformer 111$p$ and the current transformer 111$c$ is not limited to the above-described example, and those transformers may be set in any arbitrary direction. In a case where only one of the current transformer 111$p$ and the current transformer 111$c$ is set in a direction reverse to that of the above-described example, the decision result of the power flow direction of the commercial-side power is reversed to the above-described example.

Also, in the above description, values of the voltage $v_{p2}$ and the voltage $v_{c2}$ are transformed into values of the current $i_{p1}$ and the current $i_{c1}$ before a decision value is calculated. However, the voltage $v_{p2}$ and the voltage $v_{c2}$ may also be used, as they are, for calculation of the decision value. In this case, it is only required, basically, that the current $i_{p1}$ and the current in the foregoing Equations (1) to (6) are replaced with the voltage $v_{p2}$ and the voltage $v_{c2}$.

For one or more embodiments of the invention, it is also allowable to adopt private power generation systems of arbitrary systems other than solar-light power generation, such as wind power generation, diesel electric power generation and fuel cells.

Further, one or more embodiments of the invention is applicable to electric power lines of not only ordinary homes but also various types of facilities equipped with private power generation systems, such as buildings, factories, commercial facilities, and public facilities.

(Configuration Example of the Computer)

A sequence of processes by the detection device 112 as described above can be fulfilled either by hardware or by software. For fulfillment of the sequence of processes by software, programs constituting the software are installed in the computer. In this case, the term 'computer' implies computers incorporated in exclusive-use hardware, or general-use personal computers as an example which are enabled to execute various functions by installing various types of programs therein, and the like.

Figure 11:
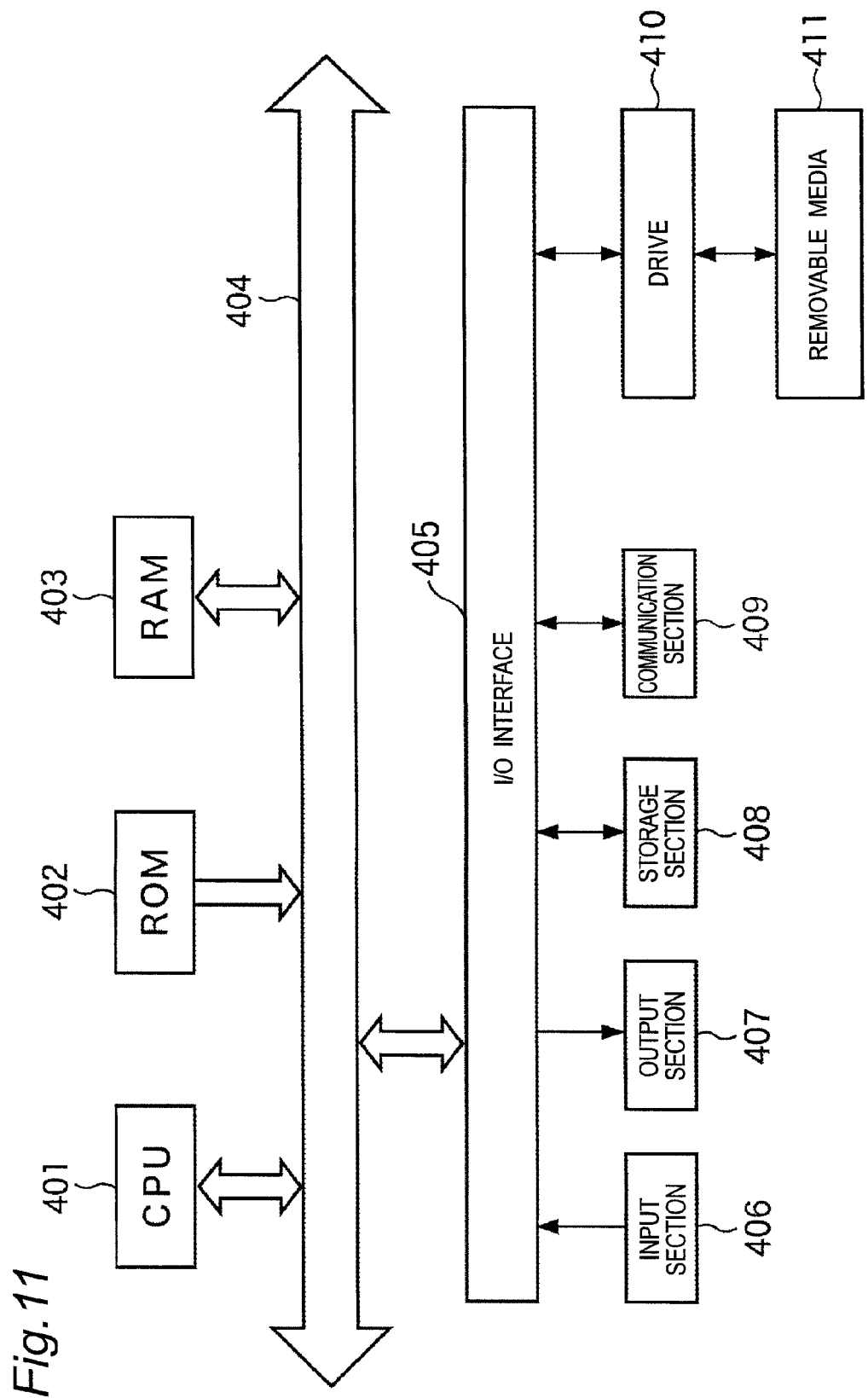
FIG. 11 is a block diagram showing a computer configuration example.

FIG. 11 is a block diagram showing a hardware configuration example of the computer for executing the above-described sequence of processes by programs.

In the computer, a CPU (Central Processing Unit) 401, a ROM (Read Only Memory) 402, and a RAM (Random Access Memory) 403 are interconnected to one another by a bus 404.

Further, an I/O (Input/Output) interface 405 is connected to the bus 404. An input section 406, an output section 407, a storage section 408, a communication section 409, and a drive 410 are connected to the I/O interface 405.

The input section 406 is made up from a keyboard, a mouse, a microphone or the like. The output section 407 is made up from a display, a loudspeaker or the like. The storage section 408 is made up from a hard disk, a nonvolatile memory or the like. The communication section 409 is made up from a network interface or the like. The drive 410 drives removable media 411 such as magnetic disks, optical disks, magnet-optical disks or semiconductor memory.

In the computer configured as shown above, for example, the CPU 401 loads programs stored in the storage section 408 to the RAM 403 via the I/O interface 405 and the bus 404 and then executes the programs so that the above-described sequence of processes are carried out.

The programs to be executed by the computer (CPU 401) can be provided, for example, as they are recorded on the removable media 411 as packaged media or the like. Also, the programs can be provided via wired or wireless transmission medium such as LAN (Local Area Network), Internet and digital satellite broadcasting.

In the computer, setting the removable media 411 to the drive 410 allows the programs to be installed to the storage section 408 via the I/O interface 405. Alternatively, the programs can be received by the communication section 409 via wired or wireless transmission media and then installed to the storage section 408. Otherwise, the programs can be installed preparatorily on the ROM 402 or the storage section 408.

In addition, the programs to be executed by the computer may be those which are processed in time series along a sequence herein described or those which are processed in parallel or at necessary timings such as call-up timings.

Herein, the term 'system' refers to whole equipment made up from a plurality of devices, means and the like.

Furthermore, embodiments of the invention are not limited to the above-described one and may be changed and modified in various ways within a scope that does not depart from the scope of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

REFERENCE SIGNS LIST 101 power monitoring system
111$p$, 111$c$ current transformer
112 detection device
121$p$, 121$c$ measuring unit
122 computing section
123 display unit (display means)
124 communication unit (communication means)
131 conversion unit
132 decision-value calculation unit (first calculation means)
133 power-flow direction detection unit (detection means)
134 power calculation unit (second calculation means)
151 solar-light power generation system (power generation means)
152 commercial power supply
153 load
162 PV controller
251, 252 current transformer

The invention claimed is:

1. A detection device for detecting a state of electric power, comprising:
    a first current transformer that measures a first current on a first power line side of a connecting point between a first power line derived from a commercial power supply and a second power line derived from a power generation device which supplies electric power equal in frequency to the commercial power supply;

a second current transformer that measures a second current on a second power line side of the connecting point;

a first calculation unit that calculates a decision value based on a product of a measured value of the first current and a measured value of the second current; and a detection unit that detects a power flow direction of electric power of the first power line based on the decision value.

2. The detection device as claimed in claim 1, wherein the first calculation unit calculates, as the decision value, a cumulated value of the products during n cycles (where n is a natural number) of the electric power of the commercial power supply.

3. The detection device as claimed in claim 1, wherein the first calculation unit calculates, as the decision value, a product of a measured value of the first current and a measured value of the second current at a point when the second current reaches a positive or negative peak.

4. The detection device as claimed in any one of claim 1, further comprising
a second calculation unit that calculates, based on a measured value of the first current and a power flow direction of electric power of the first power line, a first electric power supplied from the commercial power supply to the first power line and a second electric power supplied from the power generation device to the first power line.

5. The detection device as claimed in claim 4, wherein based on a measured value of the first current, a measured value of the second current and a power flow direction of electric power of the first power line, the second calculation unit further calculates a third electric power supplied to a load connected to the connecting point.

6. The detection device as claimed in claim 4, further comprising
a display unit that displays the first electric power and the second electric power.

7. The detection device as claimed in claim 4, further comprising
a communication unit that transmits, to outside, information including at least one combination of a combination of the first electric power and the second electric power and another combination of a measured value of the first current and a power flow direction of electric power of the first power line.

8. A detection method performed by a detection device for detecting a state of electric power, comprising:
a measurement step of measuring a first current by a first current transformer on a first power line side of a connecting point between a first power line derived from a commercial power supply and a second power line derived from a power generation device which supplies electric power equal in frequency to the commercial power supply, and measuring a second current by a second current transformer on a second power line side of the connecting point;

a calculation step of calculating a decision value based on a product of a measured value of the first current and a measured value of the second current; and a detection step of detecting a power flow direction of electric power of the first power line based on the decision value.

9. A detection device comprising:
a calculation unit that calculates a decision value based on a product of a measured value of a first current and a measured value of a second current, where the first current is measured by a first current transformer on a first power line side of a connecting point between a first power line derived from a commercial power supply and a second power line derived from a power generation device which supplies electric power equal in frequency to the commercial power supply, and where the second current is measured by a second current transformer on a second power line side of the connecting point; and a detection unit that detects a power flow direction of electric power of the first power line based on the decision value.

10. A detection method performed by a detection device for detecting a state of electric power, comprising:
a calculation step of calculating a decision value based on a product of a measured value of a first current and a measured value of a second current, where the first current is measured by a first current transformer on a first power line side of a connecting point between a first power line derived from a commercial power supply and a second power line derived from a power generation device which supplies electric power equal in frequency to the commercial power supply, and where the second current is measured by a second current transformer on a second power line side of the connecting point; and a detection step of detecting a power flow direction of electric power of the first power line based on the decision value.

11. A non-transitory computer readable medium storing a program that causes a computer to perform:
a calculation step of calculating a decision value based on a product of a measured value of a first current and a measured value of a second current, where the first current is measured by a first current transformer on a first power line side of a connecting point between a first power line derived from a commercial power supply and a second power line derived from a power generation device which supplies electric power equal in frequency to the commercial power supply, and where the second current is measured by a second current transfoimer on a second power line side of the connecting point; and a detection step of detecting a power flow direction of electric power of the first power line based on the decision value.

* * * * *